(12) United States Patent
Smith et al.

(10) Patent No.: US 7,837,817 B2
(45) Date of Patent: Nov. 23, 2010

(54) FABRICS WITH HIGH THERMAL CONDUCTIVITY COATINGS

(75) Inventors: James D Smith, Monroeville, PA (US); Gary Stevens, Surrey (GB); John W Wood, Winter Springs, FL (US)

(73) Assignee: Siemens Energy, Inc., Orlando, FL (US)

( * ) Notice: Subject to any disclaimer, the term of this patent is extended or adjusted under 35 U.S.C. 154(b) by 0 days.

(21) Appl. No.: 12/480,190

(22) Filed: Jun. 8, 2009

(65) Prior Publication Data

US 2009/0238959 A1    Sep. 24, 2009

Related U.S. Application Data

(62) Division of application No. 11/106,847, filed on Apr. 15, 2005, now Pat. No. 7,553,781.

(60) Provisional application No. 60/580,023, filed on Jun. 15, 2004.

(51) Int. Cl.
*D06M 23/08* (2006.01)

(52) U.S. Cl. .................. 156/148; 156/60; 156/276; 156/278; 156/279

(58) Field of Classification Search .............. 156/60, 156/148, 276, 278, 279
See application file for complete search history.

(56) References Cited

U.S. PATENT DOCUMENTS

| | | | |
|---|---|---|---|
| 3,246,271 A | 4/1966 | Ford | |
| 3,866,316 A | 2/1975 | Takechi et al. | |
| 3,974,302 A | 8/1976 | Croop et al. | |
| 4,001,616 A | 1/1977 | Lonseth et al. | |
| 4,160,926 A | 7/1979 | Cope et al. | |
| 4,335,367 A | 6/1982 | Mitsui et al. | |
| 4,361,661 A | 11/1982 | Jackson | |
| 4,400,226 A | 8/1983 | Horrigan | |
| 4,427,740 A | 1/1984 | Stackhouse et al. | |
| 4,491,618 A | 1/1985 | Kuwajima et al. | |
| 4,634,911 A | 1/1987 | Studniarz et al. | |
| 4,694,064 A | 9/1987 | Tomalia et al. | |
| 4,704,322 A | 11/1987 | Roberts | |

(Continued)

FOREIGN PATENT DOCUMENTS

DE    4244298 A1    6/1994

(Continued)

OTHER PUBLICATIONS

Tari et al., "Impacts on Turbine Generator Design by the Application of Increased Thermal Conducting Stator Insulation" Cigre SC11-01 Meeting, Paper No. 132 (2002).

(Continued)

*Primary Examiner*—Andrew T Piziali

(57) ABSTRACT

The present invention facilitates the thermal conductivity of fabrics by surface coating of the fabrics with high thermal conductivity materials 6. The fabrics may be surface coated when they are individual fibers or strands 4, bundles of strands, formed fabric or combinations therefore. A particular type of fibrous matrix used with the present invention is glass. Some fabrics may be a combination of more than one type of material, or may have different materials in alternating layers. HTC coatings of the present invention include diamond like coatings (DLC) and metal oxides, nitrides, carbides and mixed stoichiometric and non-stoichiometric combinations that can be applied to the host matrix.

13 Claims, 1 Drawing Sheet

U.S. PATENT DOCUMENTS

| | | |
|---|---|---|
| 4,760,296 A | 7/1988 | Johnston et al. |
| 4,806,806 A | 2/1989 | Hjortsberg et al. |
| 5,011,872 A | 4/1991 | Latham et al. |
| 5,037,876 A | 8/1991 | Birkle et al. |
| 5,126,192 A | 6/1992 | Chellis et al. |
| 5,281,388 A | 1/1994 | Palmer et al. |
| 5,409,968 A | 4/1995 | Clatanoff et al. |
| 5,466,431 A | 11/1995 | Dorfman et al. |
| 5,510,174 A | 4/1996 | Litman |
| 5,540,969 A | 7/1996 | Schuler |
| 5,578,901 A | 11/1996 | Blanchet-Fincher et al. |
| 5,688,382 A | 11/1997 | Besen et al. |
| 5,723,920 A | 3/1998 | Markovitz et al. |
| 5,780,119 A | 7/1998 | Dearnaley et al. |
| 5,801,334 A | 9/1998 | Theodorides |
| 5,878,620 A | 3/1999 | Gilbert et al. |
| 5,904,984 A | 5/1999 | Smith et al. |
| 5,938,934 A | 8/1999 | Balogh et al. |
| 5,982,056 A | 11/1999 | Koyama et al. |
| 6,015,597 A | 1/2000 | David |
| 6,048,919 A | 4/2000 | McCullough |
| 6,103,382 A | 8/2000 | Smith et al. |
| 6,130,495 A | 10/2000 | Schulten et al. |
| 6,130,496 A | 10/2000 | Takigawa et al. |
| 6,140,590 A | 10/2000 | Baumann et al. |
| 6,160,042 A | 12/2000 | Ishida |
| 6,190,775 B1 | 2/2001 | Smith et al. |
| 6,238,790 B1 | 5/2001 | Smith et al. |
| 6,251,978 B1 | 6/2001 | McCullough |
| 6,255,738 B1 | 7/2001 | Distefano et al. |
| 6,261,424 B1 | 7/2001 | Goncharenko et al. |
| 6,261,481 B1 | 7/2001 | Akatsuka et al. |
| 6,265,068 B1 | 7/2001 | David et al. |
| 6,288,341 B1 | 9/2001 | Tsunoda et al. |
| 6,344,271 B1 | 2/2002 | Yadav et al. |
| 6,359,232 B1 | 3/2002 | Markovitz et al. |
| 6,393,642 B1 | 5/2002 | Pollman et al. |
| 6,396,864 B1 | 5/2002 | O'Brien et al. |
| 6,426,578 B1 | 7/2002 | Mori et al. |
| 6,432,537 B1 | 8/2002 | Devlin et al. |
| 6,504,102 B2 | 1/2003 | Tsunoda et al. |
| 6,506,331 B2 | 1/2003 | Meguriya |
| 6,509,063 B1 | 1/2003 | McCarthy et al. |
| 6,510,059 B2 | 1/2003 | Mitani et al. |
| 6,548,172 B2 | 4/2003 | David et al. |
| 6,572,937 B2 | 6/2003 | Hakovirta et al. |
| 6,632,561 B1 | 10/2003 | Bauer et al. |
| 6,635,720 B1 | 10/2003 | Tomalia et al. |
| 6,746,758 B2 | 6/2004 | Tsunoda et al. |
| 6,821,672 B2 | 11/2004 | Zguris |
| 6,882,094 B2 | 4/2005 | Dimitrijevic et al. |
| 6,905,655 B2 | 6/2005 | Gabriel et al. |
| 6,974,627 B2 | 12/2005 | Morita et al. |
| 7,033,670 B2 | 4/2006 | Smith |
| 7,042,346 B2 | 5/2006 | Paulsen |
| 7,120,993 B2 | 10/2006 | Yamamoto et al. |
| 7,180,409 B2 | 2/2007 | Brey |
| 7,189,778 B2 | 3/2007 | Tobita et al. |
| 7,425,366 B2 | 9/2008 | Okamoto et al. |
| 7,547,847 B2 | 6/2009 | Miller |
| 2002/0058140 A1 | 5/2002 | Dana et al. |
| 2002/0070621 A1 | 6/2002 | Mori et al. |
| 2002/0098285 A1 | 7/2002 | Hakovirta et al. |
| 2002/0146562 A1 | 10/2002 | Morita et al. |
| 2003/0035960 A1 | 2/2003 | Tsunoda et al. |
| 2003/0040563 A1 | 2/2003 | Sagal et al. |
| 2003/0139510 A1 | 7/2003 | Sagal et al. |
| 2004/0094325 A1 | 5/2004 | Yoshida et al. |
| 2004/0102597 A1 | 5/2004 | Tobita et al. |
| 2004/0122153 A1 | 6/2004 | Guo et al. |
| 2004/0152829 A1 | 8/2004 | Tobita et al. |
| 2004/0241439 A1 | 12/2004 | Morita et al. |
| 2005/0097726 A1 | 5/2005 | Yamamoto et al. |
| 2005/0116336 A1 | 6/2005 | Chopra et al. |
| 2005/0161210 A1 | 7/2005 | Zhong et al. |
| 2005/0208301 A1 | 9/2005 | Okamoto et al. |
| 2005/0236606 A1 | 10/2005 | Toas et al. |
| 2005/0245644 A1 | 11/2005 | Smith et al. |
| 2005/0274450 A1 | 12/2005 | Smith et al. |
| 2005/0274540 A1 | 12/2005 | Smith et al. |
| 2005/0274774 A1 | 12/2005 | Smith et al. |
| 2005/0277349 A1 | 12/2005 | Smith et al. |
| 2005/0277350 A1 | 12/2005 | Smith et al. |
| 2005/0277351 A1 | 12/2005 | Smith et al. |
| 2005/0277721 A1 | 12/2005 | Smith et al. |
| 2006/0034787 A1 | 2/2006 | Bujard |
| 2006/0142471 A1 | 6/2006 | Shindo |
| 2006/0231201 A1 | 10/2006 | Smith et al. |
| 2006/0234027 A1 | 10/2006 | Huusken |
| 2006/0234576 A1 | 10/2006 | Smith et al. |
| 2006/0258791 A1 | 11/2006 | Okamoto et al. |
| 2006/0280873 A1 | 12/2006 | Smith et al. |
| 2006/0281380 A1 | 12/2006 | Smith et al. |
| 2006/0281833 A1 | 12/2006 | Smith et al. |
| 2007/0026221 A1 | 2/2007 | Stevens et al. |
| 2007/0114704 A1 | 5/2007 | Stevens et al. |
| 2007/0141324 A1 | 6/2007 | Stevens et al. |
| 2007/0222307 A1 | 9/2007 | Sawa et al. |
| 2008/0050580 A1 | 2/2008 | Stevens et al. |
| 2008/0066942 A1 | 3/2008 | Miller |
| 2008/0262128 A1 | 10/2008 | Stevens et al. |
| 2009/0238959 A1 | 9/2009 | Smith et al. |

FOREIGN PATENT DOCUMENTS

| | | |
|---|---|---|
| EP | 0 157 936 | 10/1985 |
| EP | 0 266 602 A1 | 5/1988 |
| EP | 0 394 767 A2 | 10/1990 |
| EP | 0604804 A2 | 7/1994 |
| EP | 1 220 240 A1 | 7/2002 |
| EP | 1 300 439 A1 | 4/2003 |
| EP | 1 383 226 A1 | 1/2004 |
| EP | 1 384 567 A1 | 1/2004 |
| EP | 1 486 997 A1 | 12/2004 |
| EP | 1 530 223 A1 | 5/2005 |
| GB | 881036 A2 | 11/1961 |
| JP | 56029305 | 3/1981 |
| JP | 03205443 A | 9/1991 |
| JP | 06076624 | 3/1994 |
| JP | 06313267 A | 11/1994 |
| JP | 08-020673 | 1/1996 |
| JP | 10-088201 | 4/1998 |
| JP | 10-211659 | 8/1998 |
| JP | 2002212422 A | 7/2002 |
| JP | 2002322243 A | 11/2002 |
| JP | 200506389 A | 1/2005 |
| JP | 2005-199562 A | 7/2005 |
| WO | WO 95/02504 A1 | 1/1995 |
| WO | 9628073 A1 | 9/1996 |
| WO | WO 98/41993 A1 | 9/1998 |
| WO | WO 99/26286 A1 | 5/1999 |
| WO | WO 2000/56127 A1 | 9/2000 |
| WO | 0168749 A1 | 9/2001 |
| WO | WO 2001/84659 A1 | 11/2001 |
| WO | WO 2003/040445 A1 | 5/2003 |
| WO | 2004006271 A1 | 1/2004 |
| WO | WO 2004/052999 A2 | 6/2004 |
| WO | WO 2004/067606 A1 | 8/2004 |
| WO | WO 2005/069312 | 7/2005 |
| WO | WO 2005/106089 A2 | 11/2005 |
| WO | WO 2005/123825 A2 | 12/2005 |
| WO | WO 2005/124790 A2 | 12/2005 |
| WO | WO 2006/002014 A1 | 1/2006 |

WO    WO 2006/007385 A1    1/2006

OTHER PUBLICATIONS

Sun et al., "Fundamental Research on Surface Modification of Nano-sized Silica for Underfill Applications" 2004 Electronic Components and Technology Conference (2004).

Brutsch et al., "New High Voltage Insulation with Increased Thermal Conductivity" Electrical Electronics Insulation Conference 1993 Proceedings, (Oct. 1993).

Tari et al., "A High Voltage System with Increased Thermal Conductivity for Turbo Generators" Coil Winding, Insulation and Electrical Manufacturing Conference (2001).

Von Roll Isola, "Mica Tapes," product literature, 381.58, date unknown.

Tomoyuki Matsumura "Phase Structures and Thermal and Conductive Properties of Epoxy-Alumina Hybrids Filled with Conductive Fillers," STN Database No. 2002:257918, Apr. 8, 2002, Abstract pp. 1-2; XP-002356007.

Yasufumi Shibata, "Lipophillic Inorganic-Organic Fillers with Low Frictional Coefficient," STN Database No. 2002:568167, Jul. 31, 2002, Abstract pp. 1-3; XP-002355912.

Derwent Acc-No. 1980-39239C (JP 55053802 A Derwent Abstract) (Nippon Mica Seisaku).

Product Data Sheet for Polar Therm Boron Nitride Powder Grades PT120, PT140, PT160, and PT 180, provided by Momentive Performance Materials (2007).

POSS® Enhanced Thermosets, Product Brochure from Hybrid Products, Inc., date unknown.

Production Information Sheet for D.E.R.™ 330 (Liquid Epoxy Resin) from the Dow Chemical Co., date unknown.

FABRICS WITH HIGH THERMAL CONDUCTIVITY COATINGS

CROSS-REFERENCE TO RELATED APPLICATIONS

This is a divisional application of U.S. patent application Ser. No. 11/106,847, filed Apr. 15, 2005, now U.S. Pat. No. 7,553,781. This application claims priority to U.S. provisional app 60/580,023, filed Jun. 15, 2004, by Smith, et al., which is incorporated herein by reference. This application is further related to U.S. patent application "Insulation Paper with High Thermal Conductivity Materials," by Smith, et al., filed herewith, which is also incorporated herein by reference.

FIELD OF THE INVENTION

This invention relates to the increase in thermal conductivity of fabrics by applying high thermal conductivity surface coatings.

BACKGROUND OF THE INVENTION

With the use of any form of electrical appliance, there is a need to electrically insulate conductors. With the push to continuously reduce the size and to streamline all electrical and electronic systems there is a corresponding need to find better and more compact insulators and insulation systems.

Good electrical insulators, by their very nature, also tend to be good thermal insulators, which is undesirable. Thermal insulating behavior, particularly for air-cooled electrical equipment and components, reduces the efficiency and durability of the components as well as the equipment as a whole. It is desirable to produce electrical insulation systems having maximum electrical insulation and minimal thermal insulation characteristics.

Though many factors affect the art of electrical insulation, the field would benefit even more from the ability to transfer heat, without reducing other desired physical characteristics of the insulators. What is needed is improved electrical insulation materials that have thermal conductivity higher than that of conventional materials, but that do not compromise the electrical insulation and other performance factors including structural integrity.

Electrical insulation often appears in the form of tapes, which themselves have various layers. Common to these types of tapes is a fabric layer that is bonded at an interface to a paper layer, both layers tending to be impregnated with a resin. The paper layer will be composed of materials that are highly electrically insulating, such as mica. Improvements in the manufacture of enhanced dielectric strength insulation tapes are taught in U.S. Pat. No. 6,190,775. If the thermal conductivity of the fabric, independent from or in conjunction with its use in a tape, can be improved then the electrical system will see marked improvement.

Additional use of fabrics is in the pre-printed circuit board industry. The circuit board backings are fabrics in sheet form impregnated with resins then laminated. Since electronics are adversely affected by heat, even slight improvements in the thermal conductivity of circuit board backings will increase efficiency. Other problems with the prior art also exist, some of which will be apparent upon further reading.

SUMMARY OF THE INVENTION

With the foregoing in mind, methods and apparatuses consistent with the present invention, which inter alia facilitates the thermal conductivity of fabrics by surface coating of the fabrics with high thermal conductivity materials. The fabrics may be surface coated when they are individual fibers or strands, bundles of strands, formed fabric or combinations therefore.

A particular type of fibrous matrix used with the present invention is glass. Other types of fibers include propylene polymers, and olefin polymers. Some fabrics may be a combination of more than one type of material, or may have different materials in alternating layers. HTC coatings of the present invention include diamond like coatings (DLC) and metal oxides, nitrides, carbides and mixed stoichiometric and non-stoichiometric combinations that can be applied to the host matrix.

These and other objects, features, and advantages in accordance with the present invention are provided particular embodiments by a fabric with a high thermal conductivity that comprises a fibrous matrix with a high thermal conductivity coating disposed on or over its surface. The high thermal conductivity coating comprise at one or more of a diamond like coating, metal oxides, metal nitrides, and metal carbides, as well as some non-metal oxides, nitrides and carbides. Examples of these include $Al_2O_3$, $AlN$, $MgO_2$, $ZnO$, $BN$, $Si_3N_4$, $SiC$ and $SiO_2$. The high thermal conductivity coating has mixed stoichiometric and non-stoichiometric combinations, and the fabric with the coating has a thermal conductivity of 50-500 W/mK.

In another embodiment the present invention provides for an electrically insulative tape that comprises a mica layer and a glass fabric layer. The glass fabric layer comprises a glass matrix with a high thermal conductivity coating disposed on the glass matrix and the high thermal conductivity coating has mixed stoichiometric and non-stoichiometric combinations. The overall thermal conductivity of the glass fabric is 50-500 W/mK.

The HTC layer can be a diamond like coating of 50-100 nm in thickness. Other types of HTC coatings include metal oxides, metal nitrides and metal carbides. In particular embodiment the overall thermal conductivity of the glass fabric is 200-500 W/mK.

In another embodiment the present invention provides for a method of forming a glass fabric with a high thermal conductivity coating that comprises surface coating pre-fabric glass fibers with a high thermal conductivity coating layer then forming the glass fibers into the glass fabric. The HTC layer comprises at least one of diamond like coating, metal oxides and combinations thereof and the glass fabric has a thermal conductivity of 50-500 W/mK.

In another method the present invention provides for forming a glass fabric with a high thermal conductivity that comprises forming pre-fabric glass fibers into the glass fabric then coating the glass fabric with a high thermal conductivity coating layer. The HTC layer comprises at least one of diamond like coating, metal oxides and combinations thereof and the glass fabric has a thermal conductivity of 50-500 W/mK.

Other embodiments of the present invention also exist, which will be apparent upon further reading of the detailed description.

BRIEF DESCRIPTION OF THE FIGURES

The invention is explained in more detail by way of example with reference to the following drawings.

DETAILED DESCRIPTION OF THE INVENTION

Figure 1:
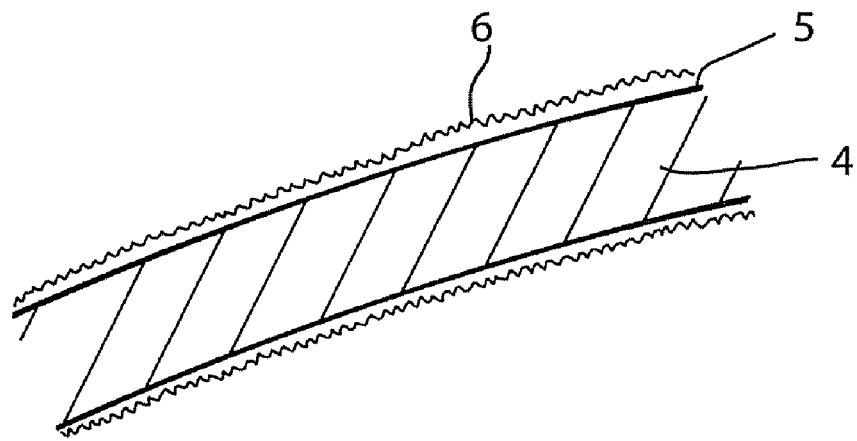
FIG. 1 illustrates a fiber coated with a diamond like coating and containing a carbon interface.

The present invention provides for a high thermal conductivity coating (HTC), such as a diamond like coating (DLC), onto a fibrous matrix. The term fibrous matrix generally refers to a fabric that is composed of fibers. As is discussed, the present invention may be applied to the fibrous matrix when it is an initial pre-fabric fiber, a finished fabric, at stages in-between and combinations thereof. The fibrous matrices are used in a variety of industries, such as backing for printed circuit boards or as a high tensile strength layer in insulating tapes.

The electrical systems that use the fibrous matrices, however, generate heat that tends to be insulated, rather than conducted away from the system, by the matrix. The accumulated heat then reduces the operating efficiency of most systems and limits the design due to insulating materials having relatively low operating temperatures. Therefore increasing the thermal conductivity of the fibrous matrix, while maintaining or even increasing tensile strength would be advantageous.

By adding the HTC coating, the fibrous matrix will conduct phonons at a greater rate. In thermal conductivity, phonon transport is enhanced and phonon scattering reduced by ensuring the length scales of the structural elements are shorter than or commensurate with the phonon distribution responsible for thermal transport. Fabrics of the present invention have effective thermal conductivity of 50-500 Watts/mK.

A particular type of fibrous matrix used with the present invention is glass. Other types of fibers include poly-imides (Kevlar™), polyamides (nylon), poly-ethylene terephthalate (Dacron™), other polymeric microfibers, polypropylene polymers, and olefin polymers. Some fabrics may be a combination of more than one type of material, or may have different materials in alternating layers.

There are a number of HTC coatings that embody the present invention, such as diamond like coatings (DLC) and various oxides, nitrides, carbides and mixed stoichiometric and non-stoichiometric combinations that can be applied to the host matrix. Examples of the oxides, nitrides and carbide include $Al_2O_3$, AlN, $MgO_2$, ZnO, BN, $Si_3N_4$, SiC and $SiO_2$. Other HTC coatings may also be apparent to one of ordinary skill in the art, and additional types of HTC coatings will likely be developed as the technology continues to progress.

A particular application of the present invention is to surface coat glass fabric used in insulating tapes. Insulating tapes typically comprise two layers, a high tensile strength glass fabric layer and a weaker but highly electrically insulative mica layer. The two layers are bound together and impregnated with a resin. The glass may be coated prior to or after being joined to the mica layer, though maximum penetration of the coating will occur before the glass and mica layers are joined. To further enhance thermal conductivity, the glass fabric may also be impregnated with a resin. The resin itself may be intercalated with HTC materials, such as nanofiller and nanofillers with DLCs.

Circuit boards are primarily composed of glass fiber reinforced epoxy or polyimide laminates. The glass fibers may be a homogenous matrix or could be imbedded in other materials such as ceramics. The fibers may be individually coated, but since circuit board components are surface mounted, a surface coating of HTC materials will suffice for some embodiments.

To add the DLCs to the glass fabric, chemical vapour deposition and physical vapour deposition may be used in which the DLC is formed within a non-equilibrium radio frequency or microwave coupled vacuum or atmospheric plasma containing low molecular weight hydrocarbons such as methane, ethane and others with hydrogen. By controlling the gas mixture condition and the plasma operating conditions the thermal conductivity of the DLCs may be controlled by altering the hybridization state of the DLC which may be controlled by changing the balance of sp2 and sp3 electron orbital bonding states which may be measured using Raman spectroscopy and X-ray photoelectron spectroscopy. The case of vacuum plasma deposition batch processing may be achieved and in the case of atmospheric plasma deposition continuous processing may be used.

The surface coating may be added to the fibrous matrix before the fibers are formed into a fabric, afterwards, or at multiple stages. Various types of surface coatings may be applied at the various stages of fabric formation, and multiple surface coatings may be applied at specific stages. For example, a light DLC is applied to loose fibers of glass that only partially coat the fibers. These fibers are then formed into a fabric and again given a DLC which produces a completed coating on the glass fibers. The coating of the matrix is more easily accomplished when it is in a formed fabric, although there can advantages to coating the individual fibers, as discussed.

The thickness of the DLC on fibers can be varied depending on the application. Most embodiments, however, will use a 20-200 nm thickness, with a particular thickness of 50-100 nm thickness coating over the average surface of the matrix. The process of chemical vapor deposition will inherently deposit a thicker coating on exposed surfaces, and volumes of the matrix that are closer to the exposed surfaces. This may be adjusted for by one of ordinary skill in art.

When fibers, such as glass, are formed into a fabric they are first coated with a starch to maintain so that fibers slide over each other properly so that they do not break. The present invention uses the starch coating differently through various embodiments. For example, the starch coating may be omitted entirely if the DLC is put onto individualized fibers. The DLC acts to keep fibers in proper aggregation for formation into a fabric. Or the starch coating may still be added to the DLC coated fibers, but in lesser amounts. There are other types of coatings, including silane, an the term starch incorporates these variations.

Figure 2:
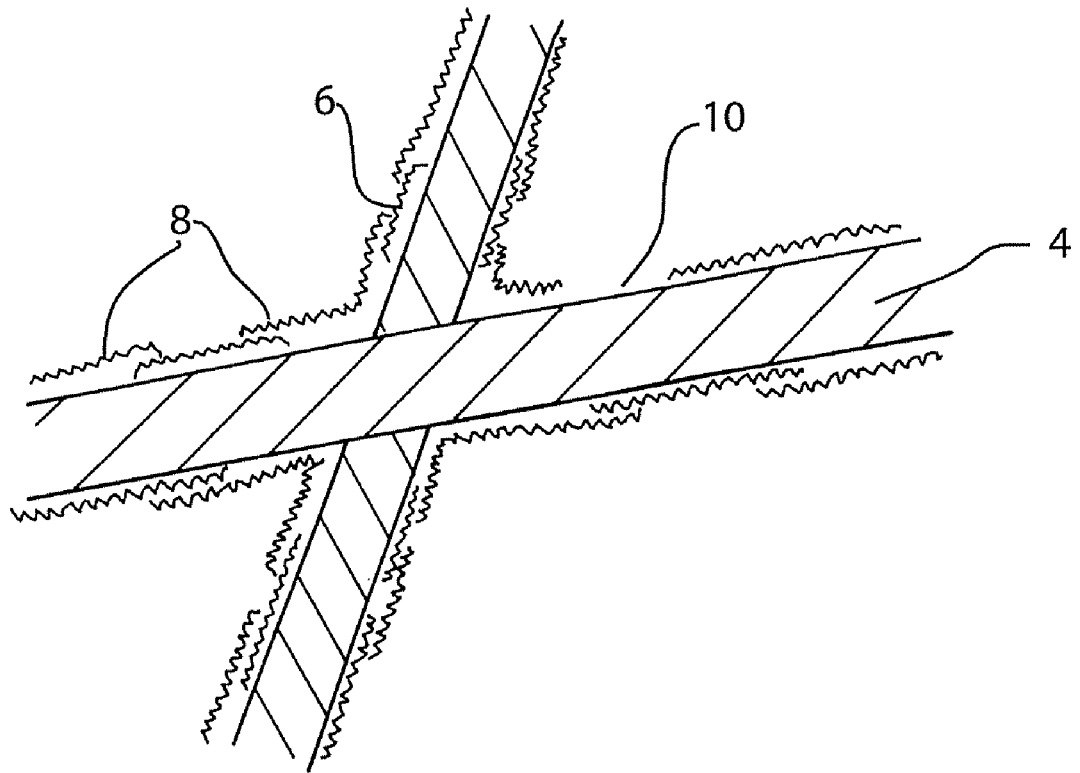
FIG. 2 illustrates two fibers overlapped and coated both prior to and after being aggregated.

FIG. 1 illustrates and example of a fiber 4 having a carbon interface 5 derived from a starch coating to which a DLC 6 is applied (which is enlarged for clairity). FIG. 2 illustrates two fibers 4 that overlap after a both fibers were partially coated with a first DLC 6 and then a second DLC 8 was applied after the fibers 4 are overlapped. In all types of applications, gaps in the DLC 10, as well as other types of HTC coatings, can be anticipated depending on the degree of application of the coating process. Reducing gaps 10 in the coating is preferred, however slightly less than 100% coverage should not significantly affect thermal conductivity and other features.

In other embodiments the starch coating is present on the fibers before the DLC or other type of HTC coating is added. In these embodiments the HTC coating may displace the starch. However, in certain embodiments the starch coating is first converted into another carbon form, referred to as an amorphous carbon layer, and acts as an intermediate layer between the matrix and the HTC coatings. This can improve the adhesion of the HTC coatings and will also reduce the strain between the HTC coating and the matrix. Strain conditions can also be controlled by the plasma reaction conditions.

Glass fabrics and fibers are used in many applications to enhance the, mainly mechanical, properties of composites. Using the methods described above to enhance the thermal conductivity of the glass fabric or glass fiber, the thermal conductivity of the composite material which incorporates such glass layers or fibers can be enhanced. The physical properties of the fibrous matrix may be further enhanced by DLC and other types of surface coatings. For example, the tensile strength of a glass fiber may be increased depending on the quality of the surface coating. Thinner fabrics can therefore be created that posses similar physical properties to their thicker, non-surface coated counterparts. The reduced thickness of the fabric will then itself aid in thermal conductivity, in addition to the enhanced thermal conductivity of the surface coatings themselves.

Diamond-Like Carbon Coatings (DLC) have high hardness, low friction, chemical inertness, and can combine high electrical resistivity ($\sim10^{13}$ Ohm cm) for electrical insulation with high thermal conductivity (>1000 W/mK). There are several methods for producing a DLC, such as plasma assisted chemical vapor deposition (PACVD), physical vapor deposition(PVD), and ion beam deposition(IBD). In general, the DLC is less than one micron thick and is of amorphous carbon and hydrocarbons which results in mixed $sp^2$ and $sp^3$ bonds. The bond ratio can be varied by varying the process parameters, for example the ratio of gases, the plasma energy, and DC voltage, with resultant changes in properties. The bond ratio can be directly measured using, for example, Raman spectroscopy.

Relatively large areas can be coated quite quickly. For example using a PACVD low pressure non equilibrium process a 20-100 nm coating can be applied to a glass cloth surface approximately 1 sq ft in area in minutes. To control or optimize the coating parameters to reduce, for example, the stress in the coating the DLC can be applied to a bare substrate or substrates that have other coatings. Pores between fibers are advantageous, for example, in allowing for better bonding of an impregnated resin.

In one embodiment the present invention provides for a fabric with a high thermal conductivity that comprises a fibrous matrix with a high thermal conductivity coating disposed its surface. The high thermal conductivity coating comprise at one or more of a diamond like coating, metal oxides, metal nitrides, and metal carbides. The high thermal conductivity coating has mixed stoichiometric and non-stoichiometric combinations, and the fabric with the coating has a thermal conductivity of 50-500 W/mK.

In a related embodiment the fibrous matrix is glass fibers. This can be formed into a layer within an insulating tape, but can also be used for other applications such as circuit boards. In these and other applications, the fabric can be impregnated with a resin, which will further aid in thermal conductivity. Other types of fibrous matrices include polymeric microfibers propylene polymers, and olefin polymers.

In one embodiment the high thermal conductivity coating is disposed on the fibrous matrix by chemical vapour deposition and in another embodiment by physical vapour deposition. The high thermal conductivity coating has an average thickness of 50-100 nm on the fibrous matrix.

In another embodiment the present invention provides for an electrically insulative tape that comprises a mica layer and a glass fabric layer. The glass fabric layer comprises a glass matrix with a high thermal conductivity coating disposed on the glass matrix and the high thermal conductivity coating has mixed stoichiometric and non-stoichiometric combinations. The overall thermal conductivity of the glass fabric is 50-500 W/mK.

The HTC layer can be a diamond like coating of 50-100 nm in thickness. Other types of HTC coatings include metal oxides, metal nitrides and metal carbides. In particular embodiment the overall thermal conductivity of the glass fabric is 200-500 W/mK.

In another embodiment the present invention provides for a method of forming a glass fabric with a high thermal conductivity coating that comprises surface coating pre-fabric glass fibers with a high thermal conductivity coating layer then forming the glass fibers into the glass fabric. The HTC layer comprises at least one of diamond like coating, metal oxides and combinations thereof and the glass fabric has a thermal conductivity of 50-500 W/mK.

In a particular method the pre-fabric glass fibers are dusted with a starch compound prior to the surface coating. The starch compound forms an amorphous carbon interlayer between the HTC layer and the glass fibers. However, in an alternate embodiment, the starch compound is displaced by the high thermal conductivity coating layer in the surface coating process.

In another method the present invention provides for forming a glass fabric with a high thermal conductivity that comprises forming pre-fabric glass fibers glass fibers into the glass fabric then coating the glass fabric with a high thermal conductivity coating layer. The HTC layer comprises at least one of diamond like coating, metal oxides and combinations thereof and the glass fabric has a thermal conductivity of 50-500 W/mK.

Although the present invention has been discussed primarily in use with electrical generation industries, the invention is equally applicable in other areas. Industries that need to increase heat transference would equally benefit from the present invention. Other focuses of the present invention include power transmission, power electronics, printed circuit boards, conventional electronics, and integrated circuits where the increasing requirement for enhanced density of components leads to the need to remove heat efficiently in local and large areas.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the inventions which, is to be given the full breadth of the claims appended and any and all equivalents thereof.

What is claimed is:

1. A method of forming a woven glass fabric having a high thermal conductivity coating comprising:

surface coating pre-fabric glass fibers with a high thermal conductivity (HTC) coating layer having an average thickness of 50-100 nm; and forming said pre-fabric glass fibers into said woven glass fabric;

wherein said HTC coating layer comprises at least one of a diamond like coating, metal oxides, or combinations thereof;

wherein said HTC coating layer has mixed stoichiometric and non-stoichiometric combinations;

wherein said woven glass fabric has a thermal conductivity of 50-500 W/mK; and wherein said coating is within said woven glass fabric.

2. The method of claim 1, wherein said pre-fabric glass fibers are dusted with a starch compound prior to said surface coating.

3. The method of claim 2, further comprising forming said starch compound into an amorphous carbon interlayer between said HTC coating layer and said pre-fabric glass fibers.

4. The method of claim 2, wherein said starch compound is displaced by said high thermal conductivity coating layer during said surface coating.

5. The method of claim 1, wherein said HTC coating layer comprises a diamond like coating.

6. The method of claim 1, further comprising, after said forming, applying a second HTC coating layer to the formed woven glass fabric.

7. The method of claim 6, wherein said surface coating comprises partially surface coating said pre-fabric glass fibers with said HTC coating layer, and further comprising, after said forming, applying a second HTC coating layer to the formed woven glass fabric.

8. A method of forming a woven glass fabric having a high thermal conductivity coating comprising:

forming pre-fabric glass fibers into said woven glass fabric; and coating said woven glass fabric with a high thermal conductivity (HTC) coating layer having an average thickness of 50-100 nm;

wherein said HTC coating layer comprises at least one of a diamond like coating, metal oxides, or combinations thereof;

wherein said HTC coating layer has mixed stoichiometric and non-stoichiometric combinations;

wherein said coating is within said woven glass fabric; and wherein said woven glass fabric has a thermal conductivity of 50-500 W/mK.

9. The method of claim 8, further comprising coating said woven glass fabric with a starch compound.

10. The method of claim 9, further comprising forming said starch compound into an amorphous carbon interlayer between said HTC coating layer and said woven glass fabric.

11. The method of claim 8, wherein said HTC coating layer comprises a diamond like coating.

12. The method of claim 8, further comprising, prior to said forming of said pre-fabric glass fibers into said fabric, coating said pre-fabric glass fibers with an initial HTC coating layer.

13. The method of claim 8, further comprising, prior to said forming of said pre-fabric glass fibers into said woven glass fabric, partially surface coating said pre-fabric glass fibers with an initial HTC coating layer, wherein said initial HTC coating layer comprises a diamond like coating.

* * * * *